United States Patent
Maniscalco et al.

(10) Patent No.: US 11,158,538 B2
(45) Date of Patent: Oct. 26, 2021

(54) INTERCONNECT STRUCTURES WITH COBALT-INFUSED RUTHENIUM LINER AND A COBALT CAP

(71) Applicant: International Business Machines Corporation, Armonk, NY (US)

(72) Inventors: Joseph F. Maniscalco, Lake Katrine, NY (US); Koichi Motoyama, Clifton Park, NY (US); Oscar van der Straten, Guilderland Center, NY (US); Scott A. DeVries, Albany, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/781,038

(22) Filed: Feb. 4, 2020

(65) Prior Publication Data

US 2021/0242082 A1 Aug. 5, 2021

(51) Int. Cl.
*H01L 21/768* (2006.01)
*H01L 23/532* (2006.01)

(52) U.S. Cl.
CPC .... *H01L 21/76846* (2013.01); *H01L 21/7684* (2013.01); *H01L 21/76802* (2013.01); *H01L 21/76877* (2013.01); *H01L 23/53238* (2013.01)

(58) Field of Classification Search
CPC ......... H01L 21/76849; H01L 21/76846; H01L 21/76802; H01L 21/76816; H01L 23/53238

See application file for complete search history.

(56) References Cited

U.S. PATENT DOCUMENTS

| | | | |
|---|---|---|---|
| 9,455,182 B2 * | 9/2016 | Edelstein | .......... H01L 21/76802 |
| 9,780,035 B1 | 10/2017 | Briggs | |
| 9,859,215 B1 | 1/2018 | Edelstein | |
| 9,941,213 B2 | 4/2018 | Edelstein | |
| 10,115,670 B2 | 10/2018 | Edelstein | |
| 10,157,784 B2 | 12/2018 | Yu | |
| 10,410,918 B2 | 9/2019 | Wu | |
| 2007/0284736 A1 * | 12/2007 | Yang | ................. H01L 21/76877 |
| | | | 257/734 |

(Continued)

OTHER PUBLICATIONS

International Search Report and Written Opinion, International Application No. PCT/IB2021/050189, International Filing Date Jan. 12, 2021, 9 pages.

(Continued)

*Primary Examiner* — Zandra V Smith
*Assistant Examiner* — John M Parker
(74) *Attorney, Agent, or Firm* — Michael A. Petrocelli

(57) ABSTRACT

An interconnect structure, and a method for forming the same includes forming recess within a dielectric layer and conformally depositing a barrier layer within the recess. A cobalt-infused ruthenium liner is formed above the barrier layer, the cobalt containing ruthenium liner formed by stacking a second liner above a first liner, the first liner positioned above the barrier layer. The first liner includes ruthenium while the second liner includes cobalt. Cobalt atoms migrate from the second liner to the first liner forming the cobalt-infused ruthenium liner. A conductive material is deposited above the cobalt-infused ruthenium liner to fill the recess followed by a capping layer made of cobalt.

4 Claims, 6 Drawing Sheets

(56) References Cited

U.S. PATENT DOCUMENTS

| | | |
|---|---|---|
| 2012/0141667 A1 | 6/2012 | Kim |
| 2012/0161320 A1 | 6/2012 | Akolkar |
| 2013/0277842 A1* | 10/2013 | Baumann .......... H01L 21/76849 |
| | | 257/751 |
| 2014/0027909 A1 | 1/2014 | Gstrein |
| 2015/0203961 A1 | 7/2015 | Ha |
| 2016/0126104 A1* | 5/2016 | Shaviv .................. C25D 7/123 |
| | | 438/653 |
| 2017/0084540 A1 | 3/2017 | Briggs |
| 2018/0005953 A1 | 1/2018 | Briggs |
| 2018/0053725 A1* | 2/2018 | Edelstein ............ H01L 21/3212 |
| 2019/0371656 A1 | 12/2019 | Chen |
| 2021/0082752 A1* | 3/2021 | Lee .................. H01L 21/76802 |

OTHER PUBLICATIONS

Williams, et al., "Interconnect Structures With Cobalt-Infused Ruthenium Liner and a Cobalt Cap", International Application No. PCT/IB2021/050189, International Filing Date Jan. 12, 2021, 19 pages.

* cited by examiner

INTERCONNECT STRUCTURES WITH COBALT-INFUSED RUTHENIUM LINER AND A COBALT CAP

BACKGROUND

The present invention generally relates to the field of complementary metal-oxide semiconductor (CMOS) devices, and more particularly to fabricating copper interconnect structures having a cobalt-infused ruthenium liner and a cobalt cap.

Typical components of an integrated circuit (IC) include transistors, capacitors, and the like. In semiconductor chip fabrication, these IC components are coupled by interconnect structures that conduct current through the different circuit layers. These interconnect structures typically take the shape of wires, trenches, or vias formed in dielectric layers above the microelectronic devices or metallization levels of the IC. Interconnect structures are typically formed by depositing a dielectric layer, etching a recess in the dielectric layer and filling the recess with a metal. Typically, interconnect structures are made of copper and can be formed using single-damascene or dual-damascene fabrication processes. In the single-damascene process, interconnect structures are manufactured independently, while in the dual-damascene process are manufactured at the same time.

Generally, interconnect structures are lined with a barrier layer located at the interface between the dielectric layer and the metal level underneath. The presence of the barrier layer can reduce electromigration (EM) problems in the IC. Electromigration may be defined as the material transport induced by the electron flow during operation under current, being the interface between the interconnect structure and the surrounding dielectric the primary path for the material transport in metal lines. In 7 nm technologies and beyond, a ruthenium (Ru) liner is used for better copper (Cu) fill. However, cobalt (Co) from the cobalt cap used to encapsulate the copper fill can diffuse into the ruthenium liner causing EM degradation, and thus representing a critical electromigration resistance (yield) concern for back-end-of-the-line (BEOL) technologies. Therefore, alternative designs and techniques for forming interconnect structures would be desirable.

SUMMARY

Shortcomings of the prior art are overcome and additional advantages are provided through the provision of a method for forming an interconnect structure that includes forming a recess within a dielectric layer, conformally depositing a barrier layer within the recess, and forming a cobalt-infused ruthenium liner above the barrier layer. The cobalt-infused ruthenium liner includes a first liner above the barrier layer and a second liner above the first liner. The first liner includes ruthenium while the second liner includes cobalt. Cobalt atoms from the second liner migrate to the first liner to form the cobalt-infused ruthenium liner. A conductive material is deposited above the cobalt-infused ruthenium liner to fill the recess, followed by the formation of a capping layer above a top surface of the conductive material, the capping layer including cobalt. The formation of the cobalt-infused ruthenium liner reduces a cobalt concentration gradient between the capping layer and the first liner that prevents cobalt migration from the capping layer.

Another embodiment of the present disclosure provides an alternate method for forming an interconnect structure that includes forming a recess within a dielectric layer, conformally depositing a barrier layer within the recess followed by conformal deposition of a first liner above the barrier layer and a second liner above the first liner. The first liner includes ruthenium while the second liner includes cobalt. A third liner is subsequently formed above the second liner, the third liner including ruthenium. The migration of cobalt atoms from the second liner to the first liner and the third liner form a cobalt-infused ruthenium liner. A conductive material is formed above the cobalt-infused ruthenium liner to fill the recess followed by the deposition of a capping layer above a top surface of the conductive material, the capping layer includes cobalt. The formation of the cobalt-infused ruthenium liner reduces a cobalt concentration gradient between the capping layer and the first liner and third liner that prevents cobalt migration from the capping layer.

Another embodiment of the present disclosure provides a semiconductor structure that includes an interconnect structure within a dielectric layer, the interconnect structure includes a barrier layer located on a bottom surface and sidewalls of the interconnect structure, a first liner directly above the barrier layer, the first liner includes ruthenium, a second liner directly above the first liner, the second liner includes cobalt, a conductive material above the second liner substantially filling the interconnect structure, and a capping layer directly above the conductive material, the capping layer including cobalt, the migration of cobalt atoms from the second liner to the first liner reduces a concentration gradient between the capping layer and the first liner that prevents diffusion of cobalt atoms from the capping layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
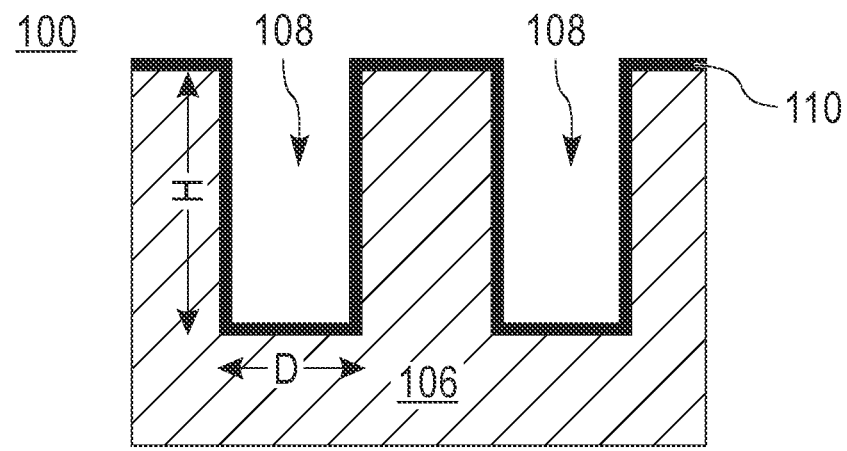
FIG. 1A is a cross-sectional view of a simplified semiconductor structure depicting forming recesses in a dielectric layer and depositing a barrier layer within the recesses, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Copper (Cu) has been used for many years in the fabrication of integrated circuit (IC) chips. Copper is a better conductor than aluminum (Al), and allows for metal components to be smaller. But, copper can cause problems if not properly contained within the interconnect structures. To properly contain copper, cobalt (Co) has been used in current 7 nm (nanometer) interconnects, both as a cobalt liner and as a cobalt cap for copper encapsulation. Unfortunately, movement/diffusion of cobalt has been linked with degraded electromigration lifetimes, particularly when the cobalt cap is combined with the ruthenium (Ru) liner typically used in 7 nm technologies to enhance copper fill.

Therefore, embodiments of the present disclosure provide a method and associated structure for fabricating copper interconnect structures having a cobalt-containing ruthenium liner and a cobalt cap. The proposed embodiments prevent the diffusion of cobalt atoms from the cobalt cap to the ruthenium liner thereby improving electromigration performance. A way of preventing cobalt diffusion from the cobalt cap includes forming a tantalum nitride layer followed by a ruthenium liner and a substantially thin cobalt liner capable of saturating the underlying ruthenium liner with cobalt atoms to form the cobalt-containing ruthenium liner which may halt the driving force for cobalt diffusion from the cobalt cap. An embodiment by which the cobalt-containing ruthenium liner can be formed in copper interconnect structures is described in detailed below by referring to the accompanying drawings in FIGS. 1A-1F. Alternate embodiments by which the cobalt-containing ruthenium liner can be formed to prevent cobalt diffusion in copper interconnects are described in detailed below by referring to the accompanying drawings in FIGS. 2A-3F.

Referring now to FIGS. 1A-1F, cross-sectional views of a simplistically depicted semiconductor structure 100 during a sequence of processing steps are shown, according to an embodiment of the present disclosure. The sequence of processing steps shown in FIGS. 1A through 1F illustrate the formation of an interconnect structure 160 in the simplistically depicted semiconductor structure 100 (hereinafter "semiconductor structure").

With reference to FIG. 1A, at this step of the manufacturing process, the semiconductor structure 100 includes a dielectric layer 106 in which recesses 108 have been formed using standard etching techniques. For illustration purposes only, without intent of limitation, only two recesses 108 are depicted within the dielectric layer 106. As known by those skilled in the art, any number of recesses 108 can be formed depending on circuit design and/or requirements.

The dielectric layer 106 is typically formed above device or metal levels (not shown) of the semiconductor structure 100. Specifically, as known by those skilled in the art, a layer of dielectric material, such as the dielectric layer 106, is deposited above active regions (not shown) of the semiconductor structure 100 and then etched to form openings or recesses that will later be filled with a conductive material to form the interconnect structure(s).

The dielectric material forming the dielectric layer 106 may include, for example, a low-k dielectric material having a dielectric constant, k, in the range of approximately 2.4 to approximately 2.7. In some embodiments, the dielectric layer 106 may include silicon oxide, silicon nitride, hydrogenated silicon carbon oxide, silicon based low-k dielectrics, or porous dielectrics. The dielectric layer 106 may be formed by any suitable deposition process such as, for example, chemical vapor deposition (CVD), physical vapor deposition (PVD), or the like.

As mentioned above, the dielectric layer 106 is etched to form the recesses 108. The recesses 108 can be formed using lithography and etch processing techniques typically used in single-damascene and dual-damascene processes. The recesses 108 may be shaped to accommodate a variety of interconnect structures (e.g., trenches, lines or vias). Typically, the recesses 108 may extend through the dielectric layer 106 to expose active regions (not shown) of the semiconductor structure 100. The recesses 108 are then filled with a conductive metal, as will be described in detailed below.

As may be known by those skilled in the art, the recesses 108 shown in FIG. 1A has been etched into the dielectric layer 106 with a determined aspect ratio (H/D) of height (=H) to width (=D). In some embodiments, the range of aspect ratios varies from approximately 0.5 to approximately 20, with aspect ratios of 1 to 10 being preferred. However, in the actual device, there may be high aspect ratios (H/D) which are greater than 20:1.

With continued reference to FIG. 1A, a barrier layer 110 is deposited on horizontal and vertical surfaces of the dielectric layer 106. Stated differently, the barrier layer 110 is deposited on a bottom surface, sidewalls and top surfaces of the dielectric layer 106, as shown in the figure. The barrier layer 110 may include any barrier material suitable for preventing the diffusion of subsequently deposited metal layers (e.g., cobalt, ruthenium or copper) into the dielectric layer 106. More particularly, the barrier layer 110 may prevent the diffusion of atoms from the subsequently formed ruthenium and cobalt liners into the dielectric layer 106, acting also as an adhesion promoting layer so that the ruthenium and cobalt liners are bonded to the dielectric layer 106. Experimental results have shown that direct deposition of ruthenium on dielectric materials may produce poor adhesion and cause delamination related reliability problems.

According to an embodiment, the barrier layer 110 includes tantalum nitride (TaN). In other embodiments, the barrier layer 110 may include alternative metal nitrides including, for example, titanium nitrate (TiN), tungsten nitride (WN), or the like. Standard deposition process can be used to form the barrier layer 110. For example, in some embodiments, the barrier layer 110 can be formed via CVD, PVD, or atomic layer deposition (ALD) processes.

The barrier layer 110 may have a thickness varying from approximately 0.5 nm to approximately 5 nm and ranges there between, although a thickness less than 0.5 nm and greater than 5 nm may be acceptable.

Figure 1B:
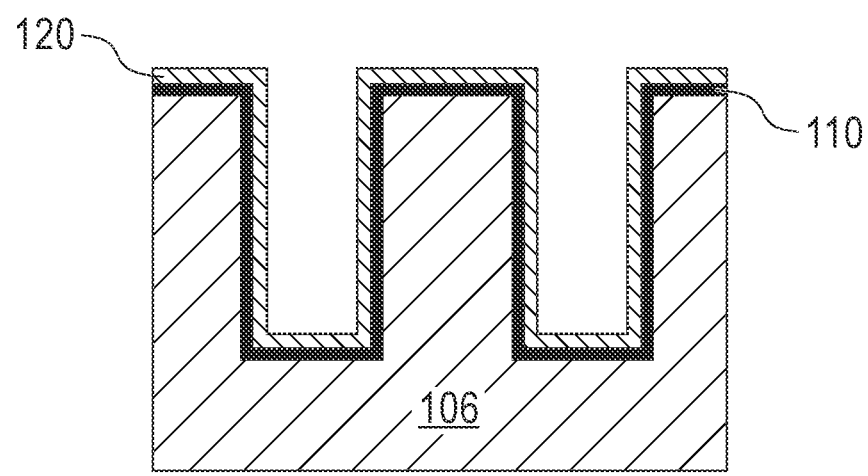
FIG. 1B is a cross-sectional view of the simplified semiconductor structure depicting the deposition of a first liner above the barrier layer, according to an embodiment of the present disclosure.

The process continues by conformally depositing a first liner 120 directly above the barrier layer 110, as depicted in FIG. 1B. In a preferred embodiment, the first liner 120 is composed substantially of, if not entirely of, ruthenium (Ru) and can be formed by standard deposition processes such as PVD, CVD, electroless plating, evaporation, or any other deposition method that deposits conformal thin films. As described above, ruthenium-containing liners, such as the first liner 120, are used in 7 nm technologies and beyond to improve copper (Cu) fill. Specifically, liners including ruthenium may adhere better to the copper seed, enabling it to be more conformal (i.e., eliminating voids) and thinner.

The first liner 120 may have a thickness varying from approximately 0.5 nm to approximately 5 nm and ranges there between, although a thickness less than 0.5 nm and greater than 5 nm may be acceptable. In an embodiment, the first liner 120 may have a thickness of approximately 10 nm.

Figure 1C:
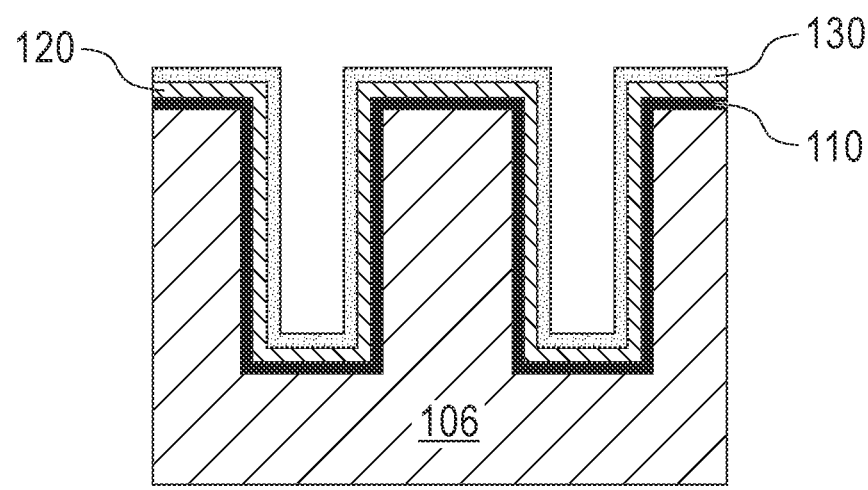
FIG. 1C is a cross-sectional view of the simplified semiconductor structure depicting the deposition of a second liner above the first liner, according to an embodiment of the present disclosure.

Following the formation of the first liner 120, a second liner 130 is formed directly above the first liner 120, as shown in FIG. 1C. The second liner 130 may include a very thin layer of a (metal) material conformally deposited on the first liner 120. In a preferred embodiment, the second liner 130 is composed substantially of, if not entirely of, cobalt (Co). Standard deposition processes such as PVD, CVD, electroless plating, evaporation, or any other deposition method that deposits conformal thin films can be used to form the second liner 130.

By forming the second liner 130 in direct contact with the first liner 120, cobalt atoms from the second liner 130 migrate to the first liner 120 (i.e., ruthenium liner) saturating the first liner 120 with cobalt such that there is no driving force for cobalt diffusion from a subsequently formed cobalt cap (e.g., first capping layer 156 in FIG. 1F). Therefore, depletion of the subsequently formed cobalt cap is prevented, which may in turn improve electromigration performance of the (first) interconnect structure(s) 160 (FIG. 1F).

It should be noted that, cobalt diffusion into the ruthenium liner (e.g., first liner 120) typically happens during thermal treatment(s) conducted on the semiconductor structure 100 during processing steps such as, for example, annealing or high temperature film deposition. Since the driving force for cobalt diffusion is the cobalt concentration gradient between the subsequently formed cobalt cap (e.g., first capping layer 156 in FIG. 1F) and the first liner 120 (i.e., the ruthenium liner), the incorporation of cobalt atoms from the second liner 130 into the first liner 120 reduces the cobalt concentration gradient between the cobalt cap and the first liner 120, thereby effectively suppressing or mitigating cobalt diffusion in the semiconductor structure 100.

A thickness of the second liner 130 may be less than the thickness of the first liner 120. According to an embodiment, the second liner 130 may have a thickness of less than approximately 5 nm. In other embodiments, the second liner 130 may have a thickness varying from approximately 0.1 nm to approximately 5 nm. In yet another embodiment, the second barrier liner may be thicker than the first liner 120.

Figure 1D:
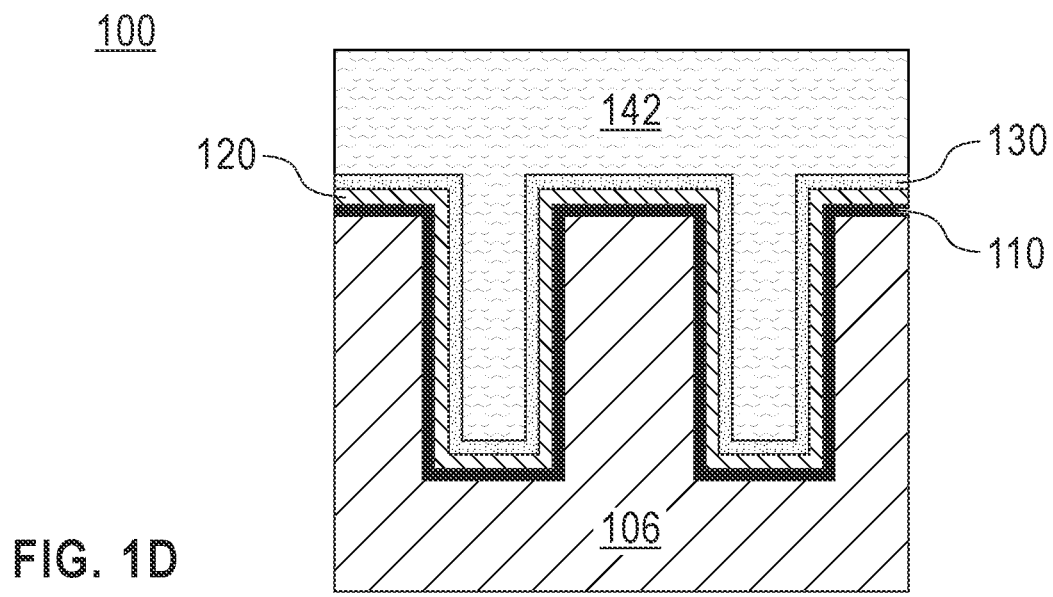
FIG. 1D is a cross-sectional view of the simplified semiconductor structure depicting the deposition of a first conductive material above the second liner, according to an embodiment of the present disclosure.

With reference now to FIG. 1D, a first conductive material 142 may be conformally deposited directly above a top surface of the second liner 130. According to an embodiment, the first conductive material 142 includes copper (Cu). In some embodiments, the first conductive material 142 may further include dopants such as, for example, manganese, magnesium, copper, aluminum, or other known dopants. The first conductive material 142 may be formed by electroplating, electroless plating, PVD, CVD, or any combination thereof.

A thickness of the first conductive material 142 may be enough to entirely fill the remaining space within the recesses 108. However, in some cases, the thickness of the first conductive material 142 may exceed the depth of the recesses 108 as shown in FIG. 1D. In these cases, a planarization process can be conducted on the semiconductor structure 100 to remove areas of the first conductive material 142 exceeding the depth of recesses 108, as depicted in FIG. 1E.

Figure 1E:
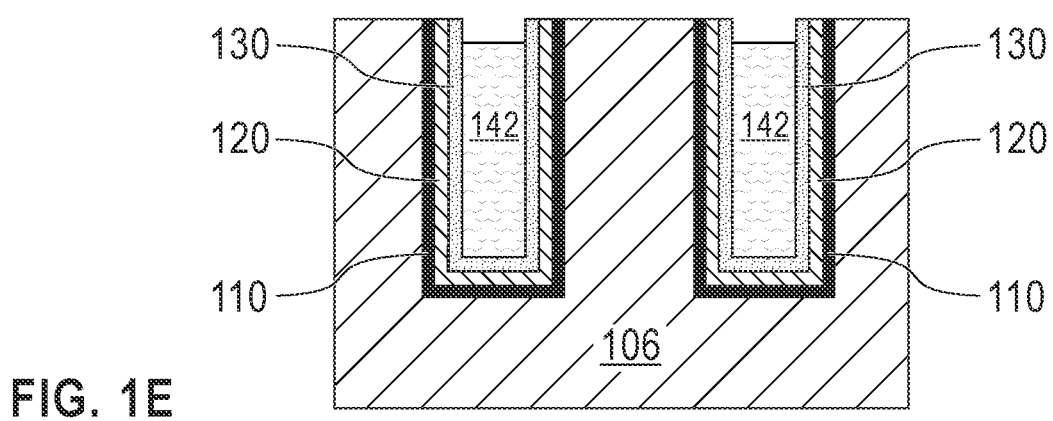
FIG. 1E is a cross-sectional view of the simplified semiconductor structure after a planarization process, according to an embodiment of the present disclosure.
Figure 1F:
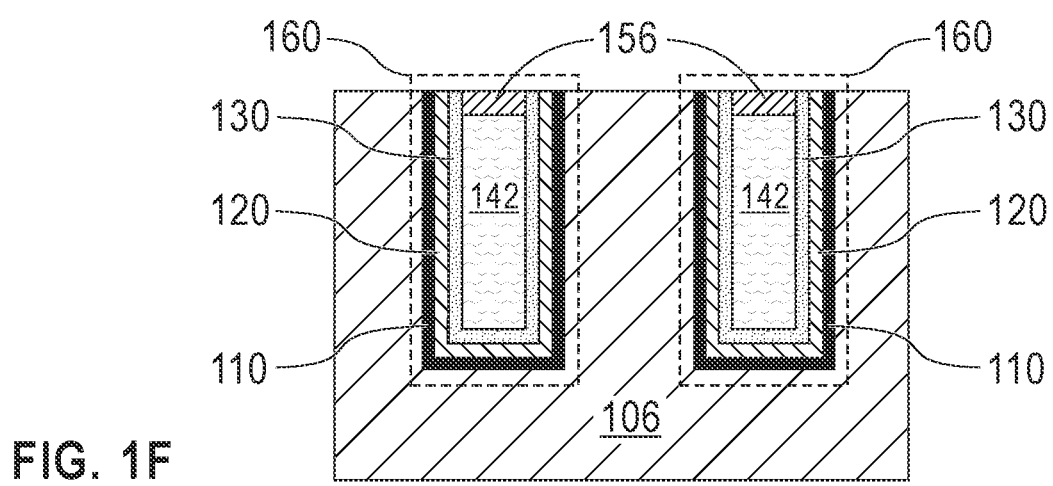
FIG. 1F is a cross-sectional view of the simplified semiconductor structure depicting first interconnect structures including a first capping layer above the first conductive material, according to an embodiment of the present disclosure.

As shown in FIG. 1E, excess portions of the first conductive material 142 may be removed from the semiconductor structure 100 by any planarization method known in the art including, for example, chemical mechanical polishing (CMP). Additionally, during the planarization process, (horizontal) portions or areas of the barrier layer 110, first liner 120, and second liner 130 parallel to the dielectric layer 106 may also be removed.

The process continues with the formation of the first capping layer 156 depicted in FIG. 1F. The first capping layer 156 is composed substantially of, if not entirely of, cobalt (Co). The first capping layer 156 may be deposited by any suitable deposition process and may have a thickness varying from approximately 0.5 nm to approximately 5 nm. As known by those skilled in the art, the first capping layer 156 is typically used in back-end-of-the-line (BEOL) technologies for encapsulating the copper (Cu) in the first conductive material 142 reducing Cu electromigration in the interconnect structure 160 and improving the overall reliability of the semiconductor structure 100.

With continued reference to FIG. 1F, a final step in the formation of the first interconnect structures 160 is shown. According to an embodiment, each of the resulting first interconnect structures 160 includes the first barrier liner 120 directly above the barrier layer 110 and the (thin) second liner 130 directly above the first liner 120, the first conductive material 142 above the second liner 130 substantially filling the first interconnect structure 160 and the first capping layer 156 above a top surface of the first conductive material 142. This configuration may prevent cobalt diffusion from the first capping layer 156 to the first liner 120. By preventing the diffusion of cobalt atoms from the first capping layer 156, depletion of the first capping layer 156 can be avoided enhancing electromigration performance. More specifically, cobalt from the second liner 130 saturates the first liner 120 made of ruthenium forming a cobalt-infused ruthenium liner capable of halting the driving force for cobalt diffusion from the first capping layer 156 due to the reduced (cobalt) concentration gradient.

Figure 2A:
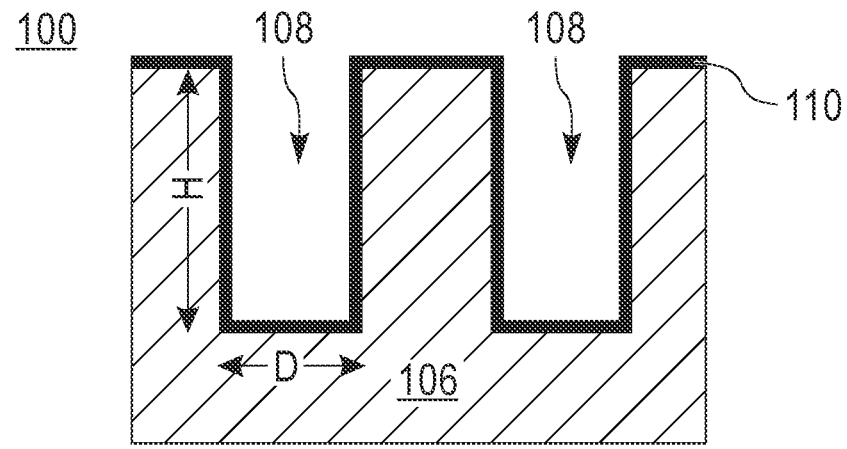
FIG. 2A is a cross-sectional view of the simplified semiconductor structure depicting forming recesses in the dielectric layer and depositing the barrier layer within the recesses, according to another embodiment of the present disclosure.
Figure 2B:
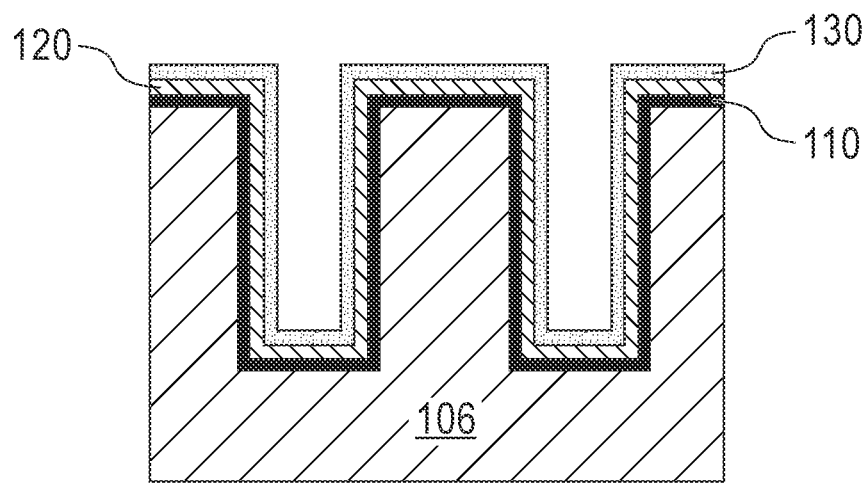
FIG. 2B is a cross-sectional view of the simplified semiconductor structure depicting the deposition of the first liner above the barrier layer and the deposition of the second liner above the first liner, according to another embodiment of the present disclosure.
Figure 2C:
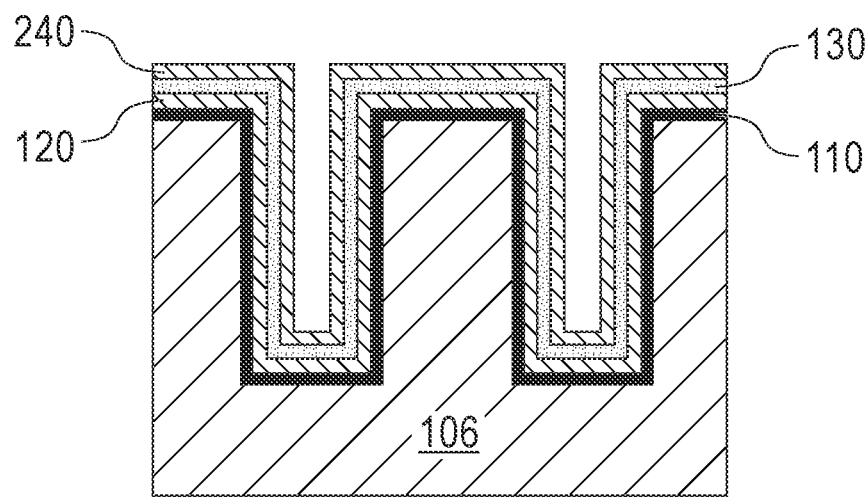
FIG. 2C is a cross-sectional view of the simplified semiconductor structure depicting the deposition of a third liner above the second liner, according to another embodiment of the present disclosure.

Referring now to FIGS. 2A-2F, cross-sectional views of the semiconductor structure 100 during an alternate processing sequence for forming an interconnect structure are shown, according to another embodiment of the present disclosure. The sequence of processing steps shown in FIGS. 2A through 2F illustrate an alternate method of forming second interconnect structures 260 in the semiconductor structure 100. The second interconnect structures 260 are formed similarly to the first interconnect structures 160 described above with reference to FIGS. 1A-1F. However, in this embodiment, after forming the second barrier liner 130 (FIG. 2B), a third barrier liner 240 is formed directly above the second barrier liner 130, as depicted in FIG. 2C.

As can be appreciated in FIG. 2C, in this embodiment, the second liner 130 is positioned between the first liner 120 and the third liner 240. According to an embodiment, the third liner 240 is made of substantially the same material as the first liner 120 (i.e., ruthenium) and can be formed using analogous deposition processes. The third liner 240 may have a thickness varying from approximately 0.5 nm to approximately 5 nm. As explained above, ruthenium-containing liners are typically used in advanced BEOL fabrication to enhance copper fill. However, the combination of ruthenium liners with cobalt caps (e.g., first capping layer 156 of FIG. 1F and second capping layer 256 of FIG. 2F) used for copper encapsulation has been linked with degraded electromigration lifetimes.

Therefore, by interposing the second liner 130 between the first liner 120 and the third liner 240, saturation of the first liner 120 and the third liner 240 by cobalt atoms from the second liner 130 can occur such that cobalt migration from the subsequently formed cobalt cap layer (e.g., capping layer 256 in FIG. 2F) can be prevented. Additionally, in this embodiment, the ruthenium (Ru)/copper (Cu) interface is maintained, enhancing copper fill performance for either copper plating or PVD copper reflow. Specifically, by depositing the third liner 240 above the second liner 130, the Ru/Cu interface remains after deposition of the second conductive material 242.

Figure 3A:
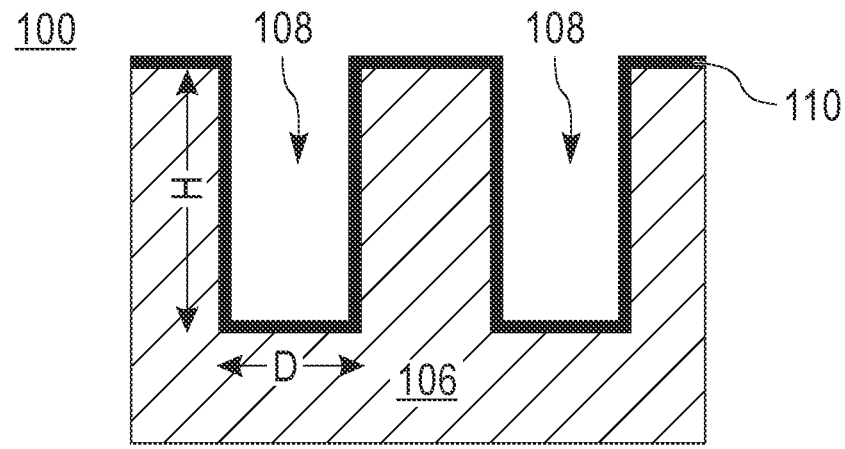
FIG. 3A is a cross-sectional view of the simplified semiconductor structure depicting forming recesses in the dielectric layer and depositing the barrier layer within the recesses, according to yet another embodiment of the present disclosure.
Figure 3B:
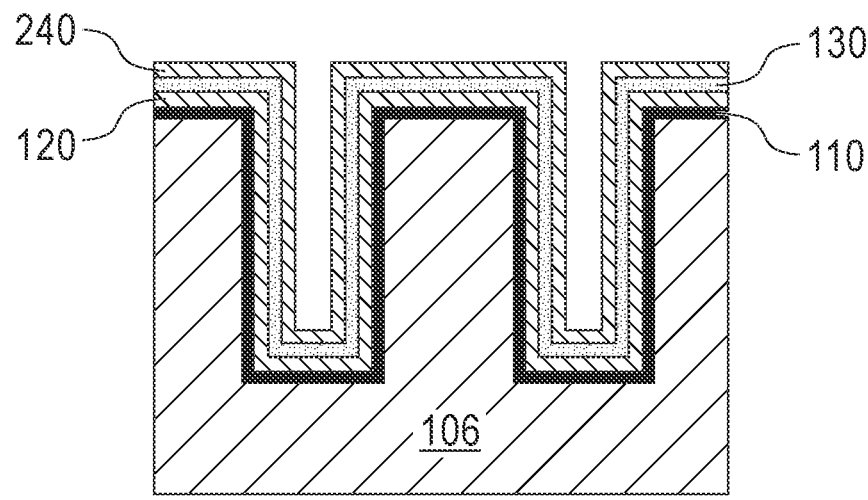
FIG. 3B is a cross-sectional view of the simplified semiconductor structure depicting the deposition of the first liner, second liner, and third liner, according to yet another embodiment of the present disclosure.
Figure 3C:
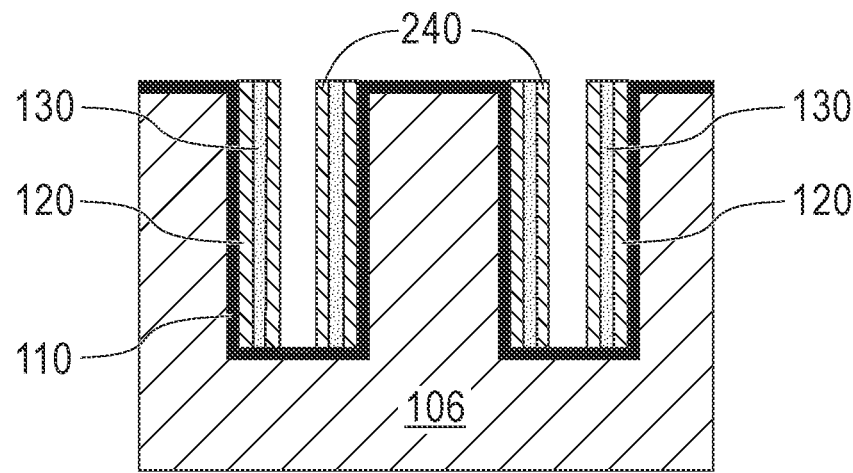
FIG. 3C is a cross-sectional view of the simplified semiconductor structure depicting removing horizontal portions of the first liner, second liner, and third liner, according to yet another embodiment of the present disclosure.
Figure 3D:
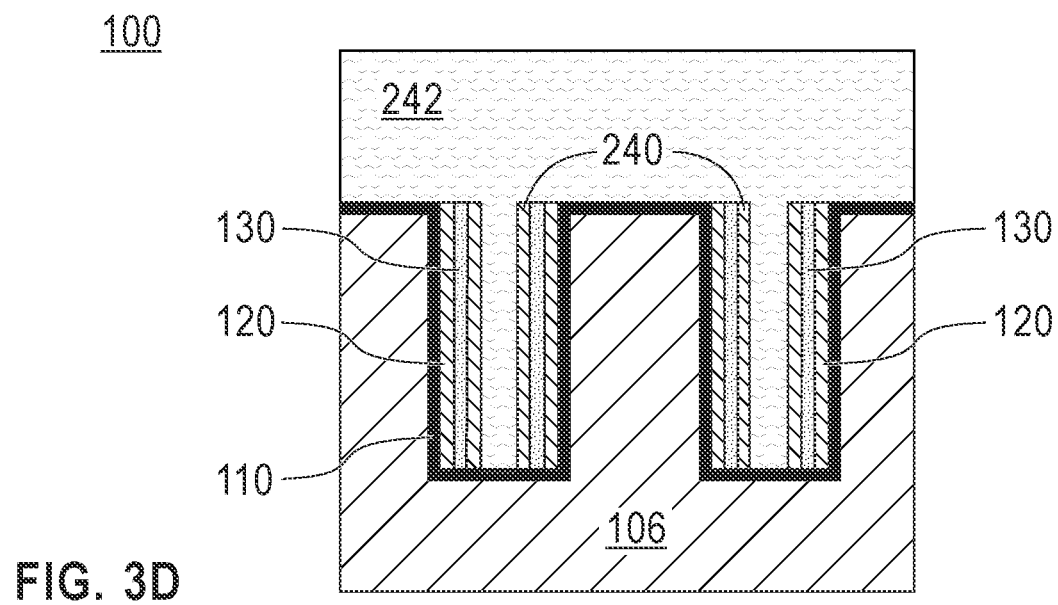
FIG. 3D is a cross-sectional view of the simplified semiconductor structure depicting the deposition of a second conductive material above the third liner, according to another embodiment of the present disclosure.
Figure 3E:
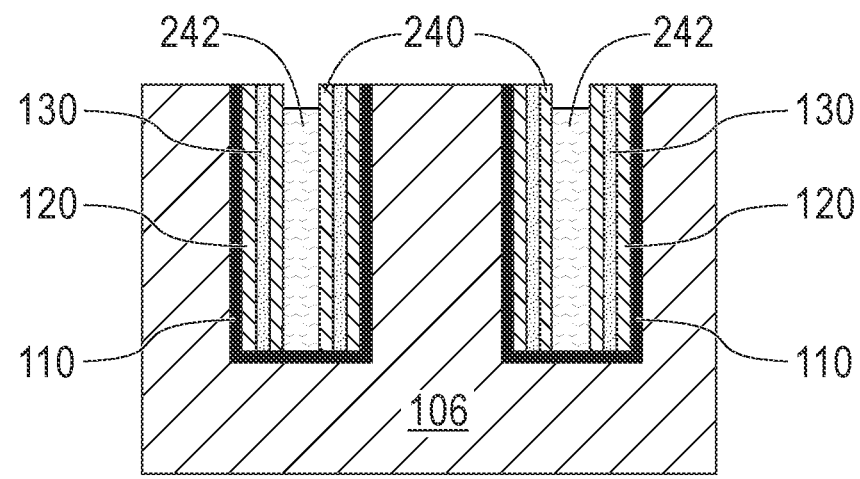
FIG. 3E is a cross-sectional view of the simplified semiconductor structure after a planarization process, according to yet another embodiment of the present disclosure.

In some embodiments, after depositing the third liner 240, an etching process can be conducted on the semiconductor structure 100 to selectively remove horizontal portions of the first, second, and third liners 120, 130 and 240 from the dielectric layer 106, as depicted in FIG. 3C. Stated differently, portions of the first, second, and third liners 120, 130 and 240 parallel to the dielectric layer 106 are selectively removed by any suitable etching process. For example, an argon (Ar) plasma etching can be conducted to remove the horizontal portions of the first, second, and third liners 120, 130 and 240 from the semiconductor structure 100.

Figure 3F:
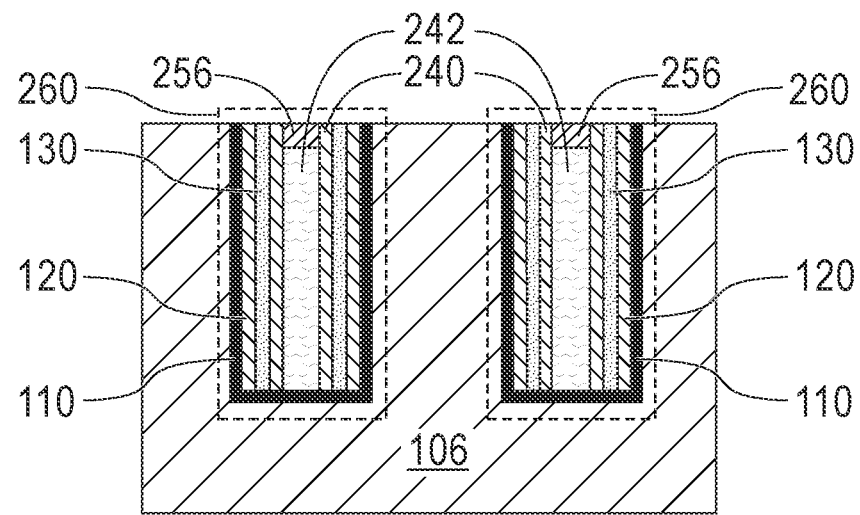
FIG. 3F is a cross-sectional view of the simplified semiconductor structure depicting second final interconnect structures including the second capping layer above the second conductive material, according to yet another embodiment of the present disclosure.

The removal of these portions of the first, second, and third liners 120, 130 and 240 exposes top (horizontal) surfaces of the barrier layer 110, as depicted in FIG. 3C. Stated differently, after the etching step of FIG. 3C, the first, second, and third liners 120, 130 and 240 remain only on opposing sidewalls of the second interconnect structures 260, as depicted in FIG. 3F. By performing this etching step (FIG. 3C), the resulting second interconnect structures 260 (FIG. 3F) may exhibit, in addition to reduced cobalt diffusion from the second capping layer 256, a reduced via resistance due to the absent of the first, second, and third liners 120, 130 and 240 on the bottom portion of the second interconnect structures 260.

Figure 2D:
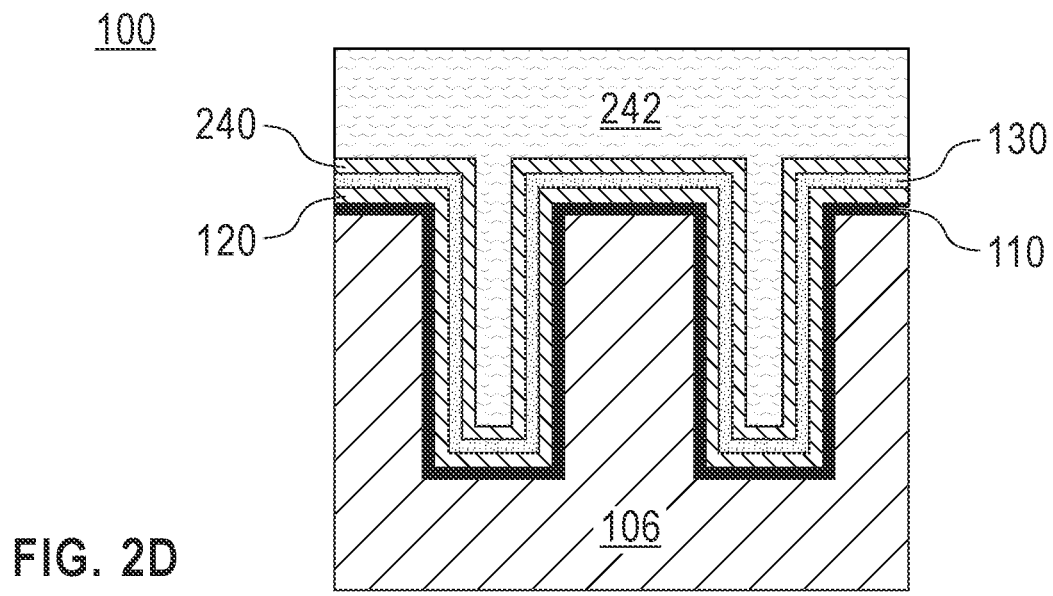
FIG. 2D is a cross-sectional view of the simplified semiconductor structure depicting the deposition of a second conductive material above the third liner, according to another embodiment of the present disclosure.

With reference now to FIG. 2D, the process continues with the deposition of a second conductive material 242, similar to the first conductive material 142 in FIG. 1D. The second conductive material 242 may be made of analogous materials and deposited in similar ways as the first conductive material 142 (FIG. 1D). It should be noted that with or without the etching step depicted in FIG. 3C, the process continues with the deposition of the second conductive material 242.

Figure 2E:
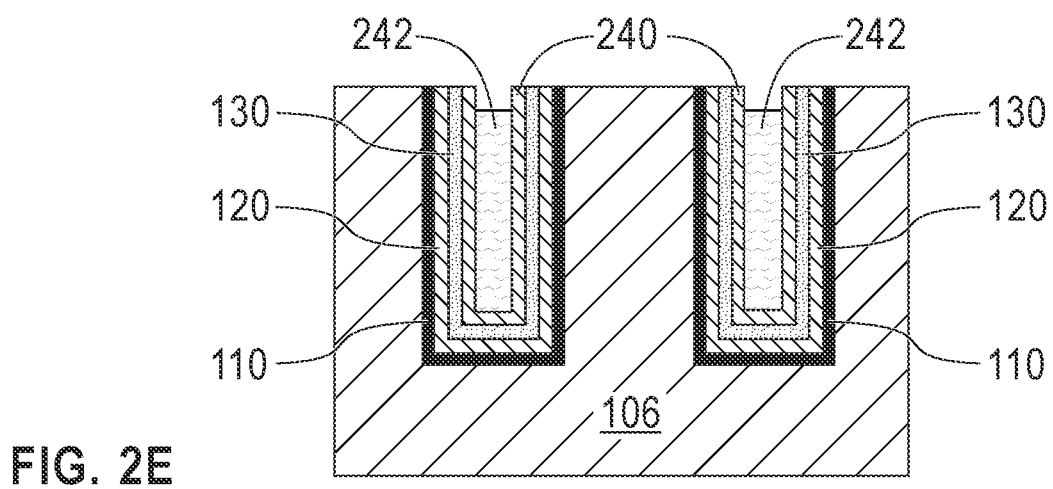
FIG. 2E is a cross-sectional view of the simplified semiconductor structure after a planarization process, according to another embodiment of the present disclosure.

As shown in FIG. 2E, excess portions of the second conductive material 242 may be removed from the semiconductor structure 100 by any planarization method known in the art including, for example, CMP. Additionally, during the planarization process, horizontal portions or areas of the barrier layer 110, first liner 120, second liner 130, and third liner 240 parallel to the dielectric layer 106 may also be removed from the semiconductor structure 100.

Figure 2F:
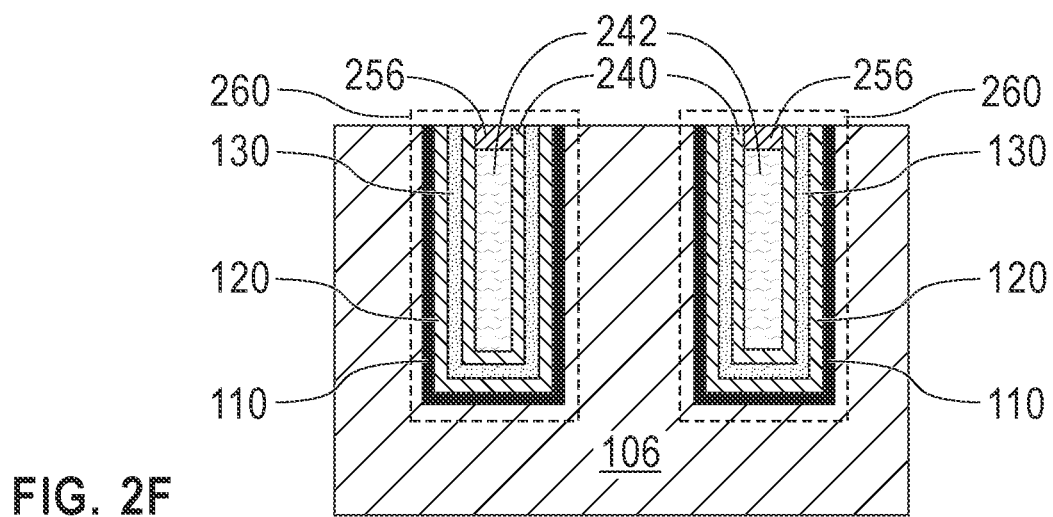
FIG. 2F is a cross-sectional view of the simplified semiconductor structure depicting second final interconnect structures including a second capping layer above the second conductive material, according to another embodiment of the present disclosure.

The process continues with the formation of the second capping layer 256 shown in FIG. 2F. The second camping layer 256 is composed of analogous materials and deposited in similar ways as the first capping layer 156 (FIG. 1F).

With continued reference to FIG. 2F, a final step in the formation of the second interconnect structures 260 is shown. According to an embodiment, each of the resulting second interconnect structures 260 includes the first liner 120 directly above the barrier layer 110 and the (thin) second liner 130 interposed between the first liner 120 and the third liner 240, the second conductive material 242 above the third liner 240 substantially filling the interconnect structures 260 and the second capping layer 256 above a top surface of the second conductive material 242. As explained above, this configuration may prevent cobalt diffusion from the second capping layer 256 to the ruthenium-containing liners (i.e., the first liner 120 and the third liner 240). By preventing the diffusion of cobalt from the second capping layer 256, depletion of the second capping layer 256 can be avoided enhancing electromigration performance. More specifically, cobalt atoms from the second liner 130 saturates the first and third liners 120, 240 made of ruthenium halting the driving force for cobalt diffusion from the second capping layer 256.

Therefore, embodiments of the present disclosure provide copper interconnect structures with enhanced electromigration performance. In an embodiment, the improved electromigration performance is achieved by forming a (thin) cobalt liner in direct contact with a ruthenium liner to form a cobalt-infused ruthenium liner caused by the migration of cobalt atoms from the cobalt liner to the ruthenium liner, this may in turn reduce the driving force for cobalt diffusion from the cobalt cap. In another embodiment, the thin cobalt liner is formed within or interposed between ruthenium liners, in these embodiments the Ru/Cu interface can be maintained further enhancing copper fill. In yet another embodiment, the cobalt/ruthenium liners can be removed from a bottom surface of the interconnect structures reducing via resistance in addition to the reduction in cobalt diffusion from the cobalt cap thereby further enhancing device performance and reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
an interconnect structure within a dielectric layer, the interconnect structure comprising:
a barrier layer located on a bottom surface and sidewalls of the interconnect structure;
a first liner directly above the barrier layer, the first liner comprises ruthenium;
a second liner directly above the first liner, the second liner comprises cobalt;
a third liner above the second liner, the third liner comprising ruthenium, wherein migration of cobalt atoms from the second liner to the first liner and the third liner form a cobalt-infused ruthenium liner;
a conductive material above the cobalt-infused ruthenium liner substantially filling the interconnect structure; and
a capping layer directly above the conductive material, the capping layer comprises cobalt, wherein the cobalt-infused ruthenium liner reduces a concentration gradient between the capping layer and the cobalt-infused ruthenium liner for preventing diffusion of cobalt atoms from the capping layer.

2. The semiconductor structure of claim 1, wherein portions of the first liner, portions of the second liner, and portions of the third liner remain on sidewalls of the interconnect structure and a bottom portion of the interconnect structure is covered only by the barrier layer.

3. The semiconductor structure of claim 1, wherein a thickness of the second liner is less than a thickness of the first liner and the third liner.

4. The semiconductor structure of claim 1, wherein the conductive material comprises copper and the barrier layer comprises tantalum nitride.

* * * * *